United States Patent

Saka

[11] Patent Number: 6,154,395
[45] Date of Patent: Nov. 28, 2000

[54] SEMICONDUCTOR MEMORY DEVICE HAVING A LAYOUT PATTERN ADJUSTED INPUT TERMINAL CAPACITANCE

[75] Inventor: Kazuyoshi Saka, Kanagawa, Japan

[73] Assignee: NEC Corporation, Japan

[21] Appl. No.: 09/344,872

[22] Filed: Jun. 28, 1999

[30] Foreign Application Priority Data

Jul. 2, 1998 [JP] Japan ................................ 10-187556

[51] Int. Cl.⁷ ........................................ G11C 7/00
[52] U.S. Cl. ...................... 365/193; 365/214; 365/225.7; 365/149
[58] Field of Search .................... 365/193, 214, 365/225.7, 149

[56] References Cited

U.S. PATENT DOCUMENTS 4,872,042  10/1989  Maeda et al. ..................... 357/23.6
5,327,392  7/1994   Ohtsuka et al. ................... 365/233
5,973,954  10/1999  Wu et al. ........................ 365/149

FOREIGN PATENT DOCUMENTS 3-116773  5/1991  Japan ........................ H01L 27/04

*Primary Examiner*—Richard Elms
*Assistant Examiner*—Tuan T. Nguyen
*Attorney, Agent, or Firm*—Hayes, Soloway, Hennessey, Grossman & Hage, P.C.

[57] ABSTRACT

An object of the invention is to provide a semiconductor memory device suppressing variations in input terminal capacitances of address input terminals and control signal input terminals and enabling a high-speed access. The invention arranges a plurality of terminal capacitance adjusting elements each of which is composed of an ESD element (punch-through element) 6a, 6b or 6c and a terminal capacitance adjusting terminal capacitance element 7a, 7b or 7c through connection changeover aluminum wiring 8a, 8b and 8c in the course of an aluminum wiring 4 from an input terminal to an internal circuit.

6 Claims, 5 Drawing Sheets

SEMICONDUCTOR MEMORY DEVICE HAVING A LAYOUT PATTERN ADJUSTED INPUT TERMINAL CAPACITANCE

BACKGROUND OF THE INVENTION

The present invention relates to a semiconductor memory device having a layout pattern adjusted input terminal capacitance of an address input terminal or an control input terminal, for example a row address strobe (RAS) or a column address strobe (CAS).

In a semiconductor memory device such as a DRAM and the like, up to now, it has been thought that an input terminal capacitance is preferably small since a large input terminal capacitance causes a signal inputted from the outside to be delayed or to increase a charging and discharging current. Due to this, in a semiconductor memory device, the maximum standard of an input terminal capacitance is prescribed and such a semiconductor memory device is designed so that its input terminal capacitance does not exceed the maximum standard.

Up to now, as a semiconductor device of this kind which has been designed so that its input terminal capacitance does not exceed the maximum standard, Japanese Patent Laid-Open Publication No.Hei 3-116773 has disclosed a semiconductor device as shown in FIG. 5. This conventional semiconductor device is provided with a plurality of input pads for a single input signal so that the same chip can be formed into any of plural different packages. In FIG. 5, numbers 20a and 20b are input terminals, 21 is a fuse circuit, 22 is an aluminum wiring and 23 is a semiconductor substrate. A semiconductor device shown in FIG. 5 can be assembled into either of packages different in their lead positions by applying a bonding process onto the input terminal 20a in case of forming a dual inline package (DIP) and onto the input terminal 20b in case of forming a small outline package (SOP). Moreover, in the semiconductor device shown in FIG. 5, a fuse circuit 21 is provided in the course of an aluminum wiring 22 to connect each of the input pads 20a and 20b to an input protection circuit, and it is disclosed to reduce an input terminal capacitance by cutting off the fuse circuit 21 provided at an unused input pad. For example, in case of assembling the semiconductor device into a DIP package using the input pad 20a, the fuse of a fuse circuit connected with the input pad 20b is cut off by a laser. On the other hand, in case of assembling the semiconductor device into an SOP package using the input pad 20b, the fuse of a fuse circuit connected with the input pad 20a is cut off by a laser. In such a manner, FIG. 5 discloses a semiconductor device reducing its input terminal capacitance by providing a fuse circuit for each of plural input pads to be connected with a single input signal and disconnecting an unused input pad by cutting off its fuse.

As shown in the above-mentioned prior art, in a semiconductor device such as a semiconductor memory and the like, it has been thought that a smaller input terminal capacitance is better, but variation in capacitance of it has been little considered. However, with the speedup of semiconductor memory devices variations in capacitance of input terminals have come to influence their high-speed performance. When the respective input terminals vary in their input terminal capacitance, the skew characteristic is deteriorated. Particularly, in a recent high-speed DRAM such as a synchronous DRAM, a rambus DRAM and the like, small variations in input terminal capacitance of an address input terminal or a control input terminal, for example a row address strobe (RAS), a column address strobe (CAS) and so forth, have come to influence their high-speed performance.

Even the same semiconductor memory chip may be changed in input terminal capacitance and be influenced in its performance, depending upon the kind of a package to be assembled, its sealing resin and the like.

SUMMARY OF THE INVENTION

An object of the present invention is to provide a novel semiconductor memory device having a layout pattern adjusted input terminal capacitance.

Another object of the present invention is to provide a semiconductor memory device preventing deterioration in skew characteristic caused by variations in input terminal capacitance and enabling a high-speed access by making it possible to bring the input terminal capacitance of a control input terminal or an address input terminal as close as possible to a certain value.

Furthermore another object of the present invention is to provide a semiconductor memory device making it possible to easily adjust the input terminal capacitance of any of different packages to be assembled to a certain value.

These and other objects of the present invention will be apparent to those of skill in the art from the appended claims when read in light of the following specification and accompanying figures.

DESCRIPTION OF THE PREFERRED EMBODIMENTS

First Embodiment

A semiconductor device of an embodiment of the present invention is described with reference to the drawings.

Figure 1:
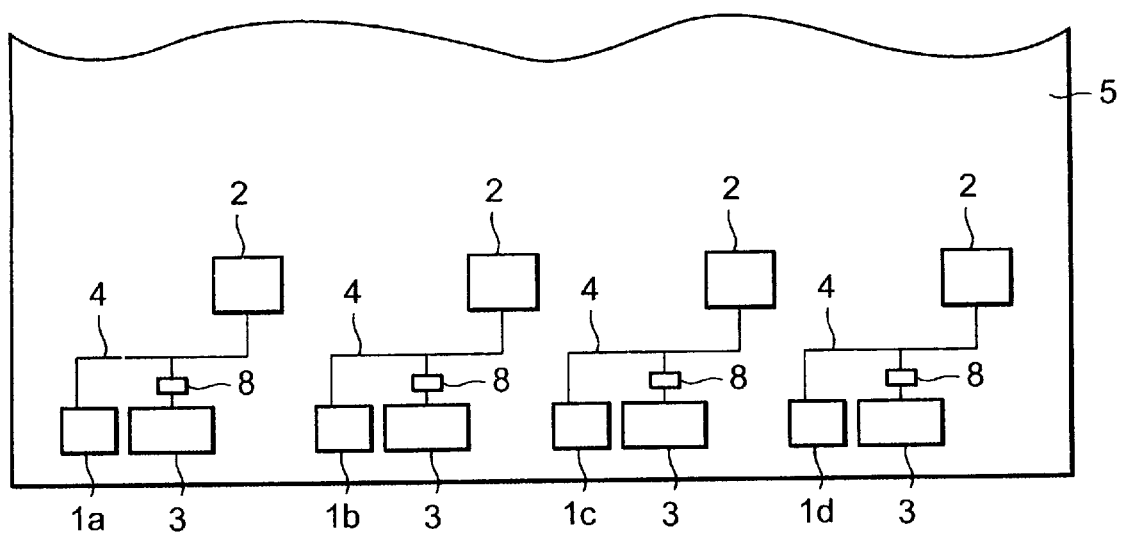
FIG. 1 is a chip layout diagram showing a semiconductor device of a first embodiment of the present invention.
Figure 2:
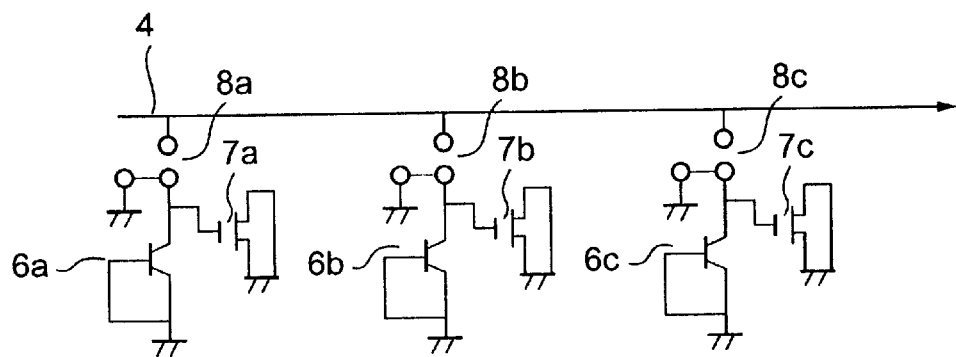
FIG. 2 is a circuit diagram of an input terminal capacitance adjusting portion of FIG. 1.

FIG. 1 is a chip layout diagram showing a semiconductor device of a first embodiment of the present invention, and FIG. 2 is a circuit diagram of an input terminal capacitance adjusting portion of FIG. 1.

As shown in FIG. 1, a semiconductor device of the first embodiment of the present invention has a composition arranging a terminal capacitance adjusting element 3 in the course of an aluminum wiring 4 to connect each of input terminals 1a, 1b, 1c and 1d to an internal circuit 2 on a semiconductor substrate 5 so as to be capable of changing over the connection by means of a connection changeover aluminum wiring 8. According to such a composition as this, the minimum standard of a terminal capacitance and variations in the respective input terminals can be easily adjusted by changing over the connection changeover aluminum wiring 8 on the basis of evaluation after a trial diffusion for the semiconductor device. The input terminal 1 and the internal circuit 2 and not shown in FIG. 2, but the left end of the aluminum wiring 4 in FIG. 2 is connected to the input terminal 1 in FIG. 1 and the right end of the aluminum wiring 4 in FIG. 2 is connected to the internal circuit 2 in FIG. 1.

Next, an input terminal capacitance adjusting method for adjusting the input terminal capacitance of a semiconductor device of an embodiment of the present invention is described in detail with reference to FIGS. 1 and 2.

As shown in FIG. 1, a connection changeover aluminum wiring 8 and a terminal capacitance adjusting element 3 are arranged in the course of an aluminum wiring 4 to connect each of input terminals 1a, 1b, 1c and 1d to an internal circuit 2. Each of the terminal capacitance adjusting elements 3 is composed of an ESD (electrostatic discharge) element (punch-through element) 6a, 6b or 6c and a input terminal capacitance adjusting capacitance element 7a, 7b or 7c which are connected in parallel with each other as shown in FIG. 2, and a desired pair of these elements connected in parallel is connected to an aluminum wiring 4 through a corresponding connection changeover aluminum wiring 8a, 8b or 8c. The gate of a terminal capacitance adjusting capacitance element not connected is set to the ground (GND) potential.

For example, it is assumed that according to evaluation after a trial diffusion of a semiconductor device the terminal capacitance of an input terminal 1a is 2.3 pF, the terminal capacitance of an input terminal 1b is 2.5 pF, the terminal capacitance of an input terminal 1c is 2.7 pF, and the terminal capacitance of an input terminal 1d is 3.1 pF. And in FIG. 2, it is assumed that a terminal capacitance adjusting capacitance element 7a is 0.25 pF, an element 7b is 0.5 pF, and an element 7c is 1.0 pF. And supposing that the minimum standard of a terminal capacitance is 2.5 pF, the terminal capacitance of the input terminal 1a is out of the standard. And variations in terminal capacitance of the respective input terminals are 0.2 pF at a minimum and 0.8 pF at a maximum. If a capacitance of 0.75 pF is connected to the input terminal 1a and a capacitance of 0.75 pF is connected to the input terminal 1b and a capacitance of 0.5 pF is connected to the input terminal 1c and no capacitance is connected to the input terminal 1d, the input terminal 1a becomes 3.05 pF and the input terminal 1b becomes 3.25 pF and the input terminal 1c becomes 3.2 pF and the input terminal 1a becomes 3.05 pF, and the input terminal 1a satisfies the minimum standard and variations among the respective terminals become 0.05 pF at a minimum and 0.2 pF at a maximum.

As described above, in an input terminal capacitance adjusting operation, modification in connection of a terminal capacitance adjusting element to an aluminum wiring from an input terminal to an internal circuit is performed to an aluminum mask. Since this modification is performed at the same time as an aluminum pattern forming process by using this aluminum mask, the input terminal capacitance adjusting operation can be easily performed without adding another process.

Second Embodiment

Figure 3:
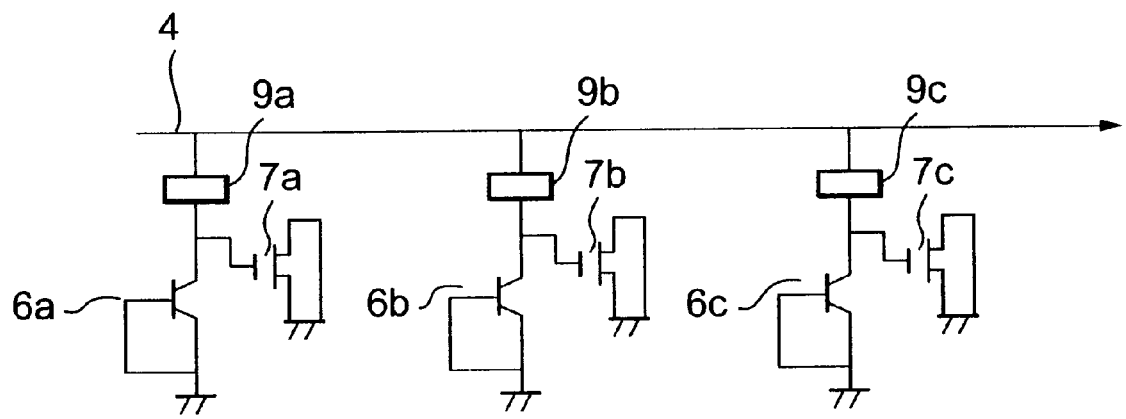
FIG. 3 is a circuit diagram of an input terminal capacitance adjusting portion of a second embodiment of the present invention.
Figure 4:
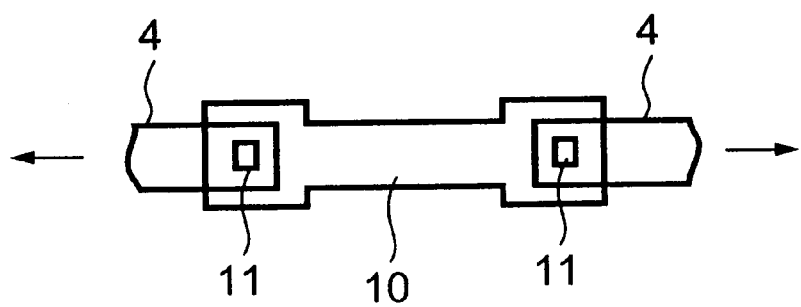
FIG. 4 is a plan view showing a fuse circuit of FIG. 3.
Figure 5:
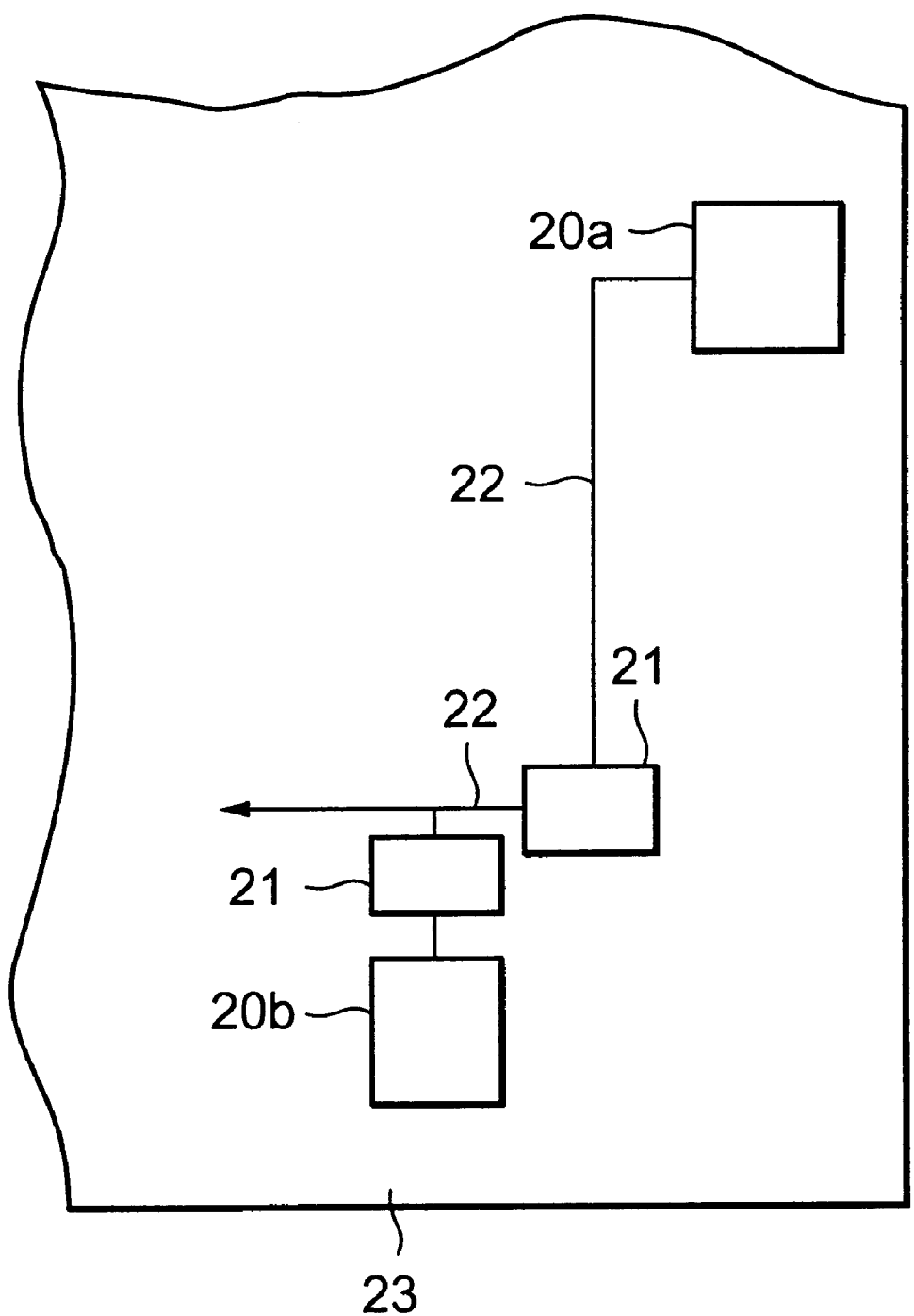
FIG. 5 is a chip layout diagram showing a conventional semiconductor device for reducing input terminal capacitance.

Next, a second embodiment of a semiconductor memory device of the present invention is described with reference to FIG. 3. As shown in FIG. 3, this embodiment uses connection changeover fuse circuits 9a, 9b and 9c instead of the above-mentioned connection changeover aluminum wiring in the first embodiment of the present invention. The input terminal 1 and the internal circuit 2 are not shown in FIG. 2, but the left end of the aluminum wiring 4 is connected to the input terminal 1 and the right end of the aluminum wiring 4 is connected to the internal circuit 2, as same as FIG. 2. FIG. 4 is a plan view of this fuse circuit, and number 4 represents aluminum wiring, 11 represents contacts and 10 represents a fuse metal wiring.

Explaining the principle of operation of this fuse circuit, in an ordinary case this fuse circuit electrically connects a terminal capacitance adjusting capacitance element and an input terminal to each other through the contacts 11 and the fuse metal wiring 10, but in case that the terminal capacitance adjusting capacitance element is not necessary it electrically disconnects them from each other by cutting off the fuse metal wiring 10 by means of a laser. ESD protection elements 6a, 6b and 6c and terminal capacitance adjusting capacitance elements 7a, 7b and 7c which are respectively connected in parallel with each other are respectively connected with the connection changeover fuse circuits 9a, 9b and 9c, and the connection changeover fuse circuits 9a, 9b and 9c are connected to the aluminum wiring 4 to connect an input terminal to an internal circuit.

The terminal capacitance adjusting capacitance element 3 can easily adjust the minimum standard of a terminal capacitance and variations in the respective input terminals by cutting off a specified connection changeover fuse circuit 9a, 9b or 9c on the basis of evaluation after a trial diffusion of a semiconductor device.

The number of pairs each of which is composed of an ESD element (punch-through element) and a terminal capacitance adjusting capacitance element which are connected in parallel with each other is not limited only if it is plural, although a case that it is three has been described.

Third Embodiment

Figure 6:
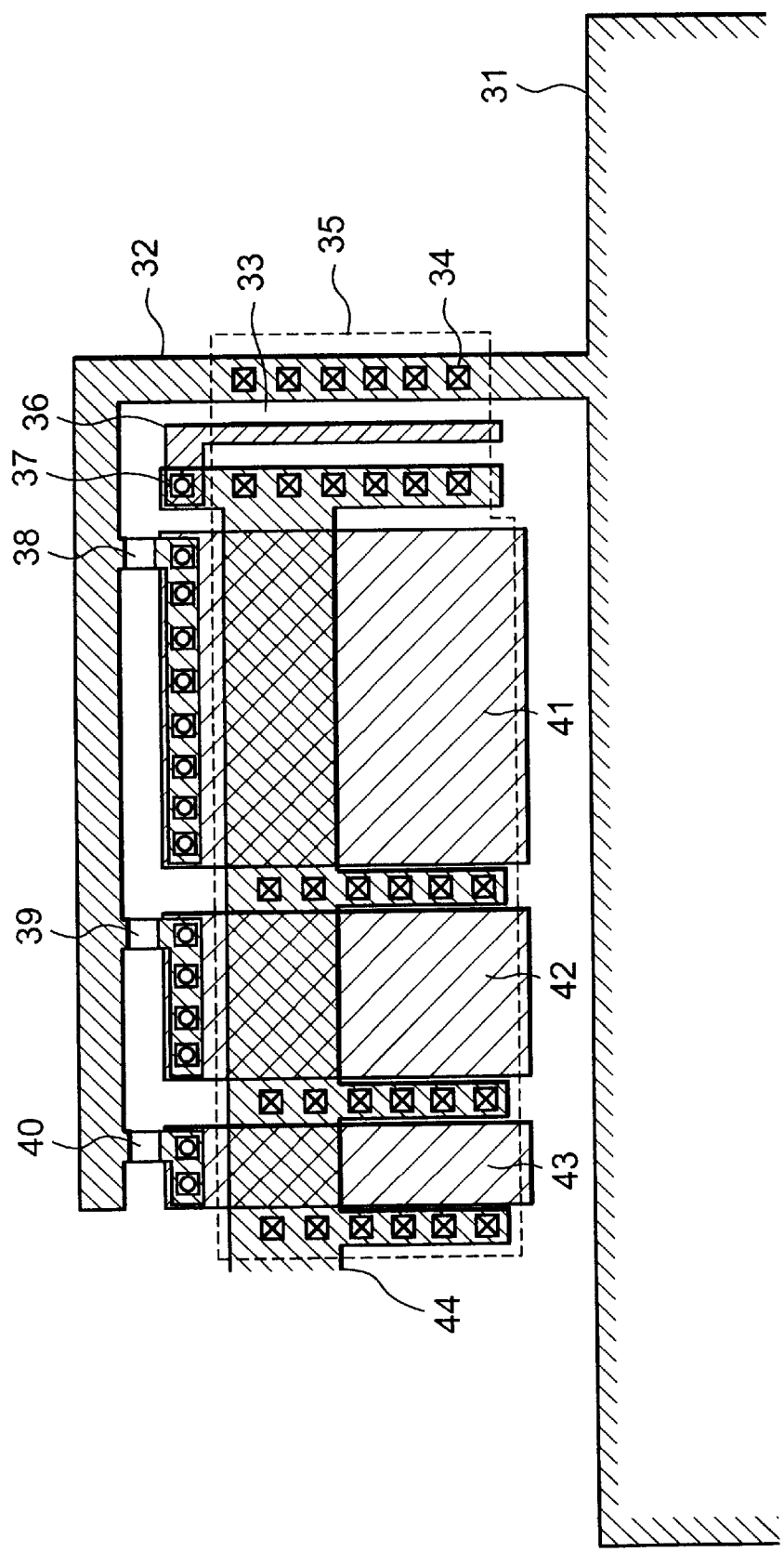
FIG. 6 is a chip layout diagram showing a semiconductor device of a third embodiment of the present invention.

Next, a third embodiment of a semiconductor memory device of the present invention is described with reference to FIG. 6. The semiconductor memory device of the present invention has a plurality of address input terminals and control signal input terminals. FIG. 6 shows only one of their input terminals. But the other input terminals are almost the same layout as the input terminal portion layout in FIG. 6.

As shown in FIG. 6, a metal wiring 32 connects an in put terminal pad 31 and an ESD element 33. In put terminal pad 31 is also connected to an internal circuit receiving input address signal or input control signal inputted from the input terminal pad 31. (Wiring to the internal circuit is not shown in FIG. 6.) The metal wiring 32 consists of aluminum or this kind of metal.

ESD element 33 is a BVDS (Source-drain breakdown voltage) transistor for protecting capacitance elements 41, 42, 43 from ESD. ESD element 33 and capacitance elements 41, 42, 43 are formed on an N-type diffusion layer 35. A drain of BVDS transistor 33 is connected to the metal wiring 32 through contact 34. And a source of the BVDS transistor 33 is connected to ground line 44. A gate of the BVDS transistor 33 is connected with the source through a contact 37. A poly-silicon layer 36 is distinguished from the metal layer 32 by a direction of a diagonal lines in FIG. 6, And the mark of the contact 37 between the metal layer 32 and the poly-silicon layer 36 is distinguished from the mark of the contact 34 between the metal layer 32 and the diffusion layer 35 by the mark in a square.

The metal wiring 32 is elongated from the input terminal pad 31 through the ESD element 33 to near by each of the capacitance elements 41, 42, 43. And the elongated metal wiring is disposed along with the plurality of the capacitance elements 41, 42, 43. The interval between the metal wiring 32 and each of the capacitance elements 41, 42, 43 are easily filled up with changeover metal wiring 38, 39, 40. Each of capacitance elements 41, 42, 43 is formed between the poly-silicon layer 36 and the diffusion layer 35.

Figure 7:
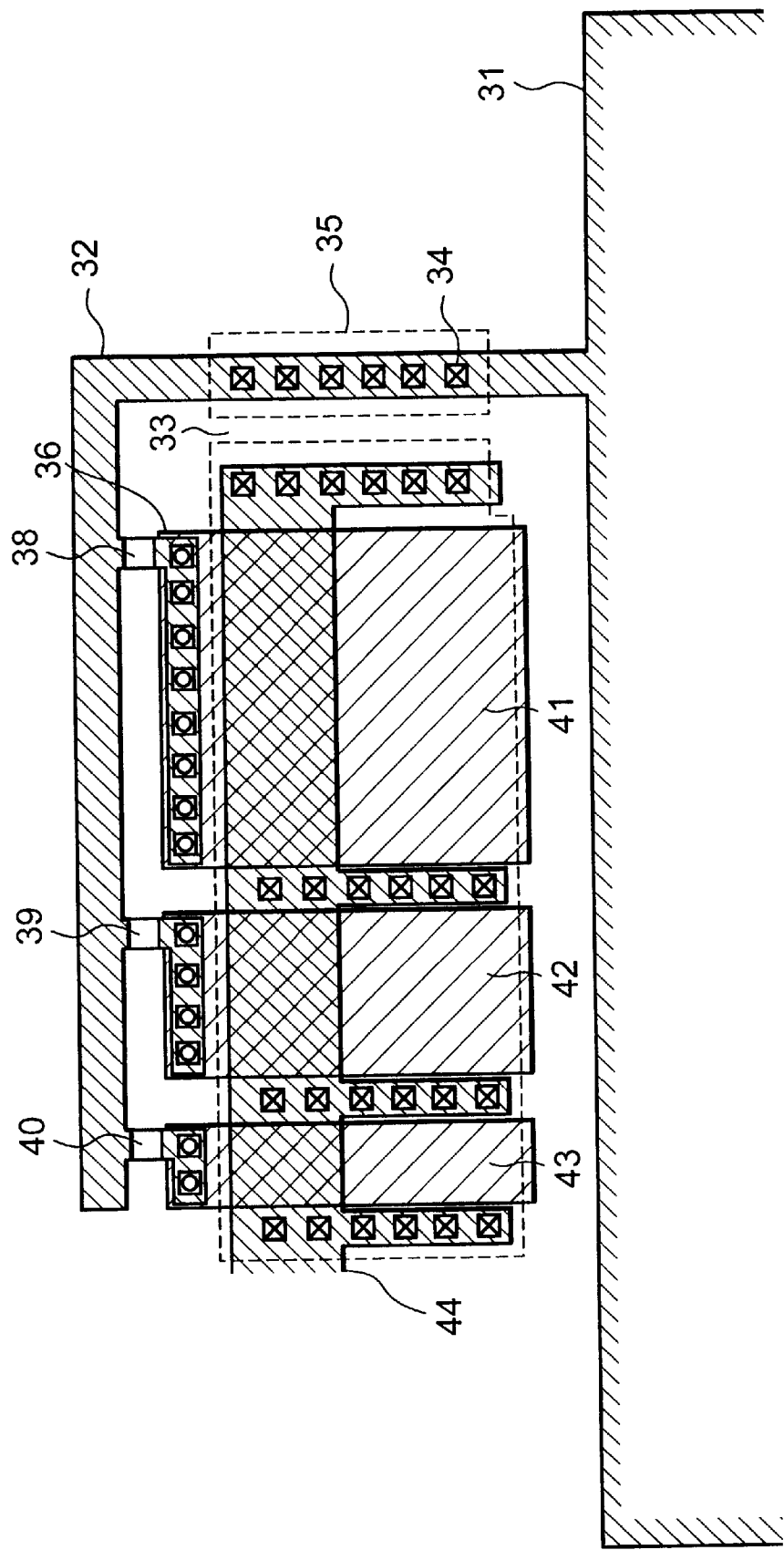
FIG. 7 is a chip layout diagram showing a semiconductor device of a variation of third embodiment of the present invention.

Next, FIG. 7 discloses a variation of the third embodiment. In FIG. 7, ESD element 33 is a punch-through transistor. A gap between the diffusion layer 35 connected to the input terminal 31 and the diffusion layer 35 connected to the ground line 44 functions as a punch through element. The other elements in FIG. 7 are almost the same as the same numbered elements in FIG. 6.

As described above, a semiconductor device of the present invention has an effect of making it possible to easily adjust a terminal capacitance of it and suppress variations in terminal capacitance of the respective terminals by modifying an aluminum wiring or cutting off a fuse circuit on the basis of evaluation after a trial diffusion, by arranging a plurality of terminal capacitance adjusting capacitance elements in the vicinity of each of its input terminals.

While preferred embodiments of the present invention have been described, it is to be understood that the invention is to be defined by the appended claims when read in light of the specification and when accorded their full range of equivalent.

What is claimed is:

1. A semiconductor memory device comprising:

an input terminal receiving an input signal;

an internal circuit provided with the input signal;

a plurality of capacitance elements disposed so as to be able to connect with the input terminal;

further comprising an input protection circuit connected with the input terminal by a metal wiring;

wherein each of the capacitance elements are disposed so as to be able to connect with the input terminal by extending the metal wiring from the input terminal through the input protection circuit;

wherein each of the capacitance elements comprises a first terminal connected with a first voltage source, a second terminal disposed so as to be able to connect with the metal wiring by extending the metal wiring; and wherein the input protection circuit is a MOS transistor comprising a drain terminal connected with the metal wiring, a gate terminal connected with a second voltage source, and a source terminal connected with a third voltage source.

2. The semiconductor memory device as claimed in claim 1; wherein the first voltage source, the second voltage source, and the third voltage source are ground.

3. The semiconductor memory device as claimed in claim 1; wherein input terminal is an address input terminal or a control signal input terminal.

4. The semiconductor memory device as claimed in claim 1; further comprising a plurality of input protection circuits; wherein each of the input protection circuits is connected with associated one of the capacitance elements.

5. The semiconductor memory device as claimed in claim 4; further comprising a plurality of fuses; wherein each of the fuses is associated with each of the capacitance elements, one end of each of the fuses is connected with associated one of the capacitance elements and associated one of the input protection circuits, and another end of each of the fuse is connected with the input terminal.

6. The semiconductor memory device as claimed in claim 1; wherein input protection circuit is a punch-through element.

\* \* \* \* \*